United States Patent
Magnitski et al.

(10) Patent No.: US 6,522,616 B1
(45) Date of Patent: Feb. 18, 2003

(54) MULTILAYER OPTICAL INFORMATION STORAGE MEDIUM BASED ON INCOHERENT SIGNAL

(75) Inventors: Serguei Alexandrovitch Magnitski, Moscow (RU); Andrei Valentinovitch Tarasishin, Moscow (RU); Eugene Levich, New York, NY (US); Jacob Malkin, Rehovot (IL); Tatiana Yurievna Lissovskaia, Moscow (RU)

(73) Assignee: TriDStore IP LLC, New York, NY (US)

( * ) Notice: Subject to any disclaimer, the term of this patent is extended or adjusted under 35 U.S.C. 154(b) by 0 days.

(21) Appl. No.: 09/501,791

(22) Filed: Feb. 11, 2000

Related U.S. Application Data

(60) Provisional application No. 60/119,902, filed on Feb. 12, 1999.

(51) Int. Cl.[7] .................................................. G11B 7/00
(52) U.S. Cl. ................................. 369/103; 369/44.11
(58) Field of Search ................................. 369/103, 118, 369/94, 283, 284, 275.3, 44.38, 44.23, 44.11, 44.26; 365/235, 234, 127; 430/270.15, 270.11

(56) References Cited

U.S. PATENT DOCUMENTS

| | | | |
|---|---|---|---|
| 4,219,704 A | | 8/1980 | Russell ..................... 179/100.3 |
| 4,864,630 A | | 9/1989 | Arnold et al. ................ 382/46 |
| 5,212,148 A | * | 5/1993 | Roas et al. .................. 427/596 |
| 5,379,266 A | | 1/1995 | Russell ........................ 365/234 |
| 5,416,494 A | | 5/1995 | Yokota et al. ................. 345/79 |
| 5,559,784 A | * | 9/1996 | Ota .............................. 369/94 |
| 5,568,417 A | | 10/1996 | Furuki et al. ............... 365/106 |
| 5,703,436 A | | 12/1997 | Forrest et al. .............. 313/506 |
| 5,792,561 A | | 8/1998 | Whang et al. .............. 428/457 |
| 6,009,065 A | * | 12/1999 | Glushko et al. ............... 369/94 |
| 6,020,985 A | * | 2/2000 | McLeod et al. ............ 369/103 |
| 6,026,053 A | * | 2/2000 | Satorius ...................... 365/235 |
| 6,071,671 A | * | 6/2000 | Glushko et al. ............ 369/284 |

FOREIGN PATENT DOCUMENTS

| | | |
|---|---|---|
| GB | 1 298 462 | 12/1972 |
| WO | WO 96/37888 | 11/1996 |
| WO | WO 98/25262 | 6/1998 |
| WO | WO 99/09550 | 2/1999 |

* cited by examiner

*Primary Examiner*—Thang V. Tran
(74) *Attorney, Agent, or Firm*—Blank Rome Comisky & McCauley LLP

(57) ABSTRACT

A multilayer optical information storage medium, such as a card, uses a luminescent, fluorescent, or electroluminescent material to reproduce information in the form of incoherent radiation. Each layer has multiple pages of information. A specific page on a specific layer is addressed by moving the card relative to a read head so that the image of the specific page to be read is focused on the read head. This can be accomplished by moving the card in the X, Y, and Z directions, or by holding the card stationary and by moving a two-dimensional image detector in the X, Y, and Z directions.

13 Claims, 6 Drawing Sheets

MULTILAYER OPTICAL INFORMATION STORAGE MEDIUM BASED ON INCOHERENT SIGNAL

REFERENCE TO RELATED APPLICATION

This application claims the benefit of U.S. Provisional Application No. 60/119,902, filed Feb. 12, 1999, whose disclosure is hereby incorporated by reference in its entirety into the present disclosure.

BACKGROUND OF THE INVENTION

The present invention is directed to a multilayer optical information storage medium and more particularly to such a medium in which the information is reproduced through an incoherent signal generated through luminescence, fluorescence, electroluminescence, or the like. The present invention is further directed to a device for reading such a storage medium.

The best known currently used technology of mass optical storage is the CD-ROM. Information is stored in the form of pits in a spiral track on a medium. Coherent light is directed onto the track while the disk is spun to reproduce the information. A recent variation, the DVD-ROM, increases the recording density and also allows two layers per side.

However, the use of coherent light gives rise to diffraction effect and thus reduces the maximum possible recording density. Also, the number of layers per side is limited to two for the DVD-ROM and one for the CD-ROM. Further, the need to spin the disk increases the mechanical complexity of a device for reproduction of the information, especially since the current CD-ROM format requires a constant linear speed and thus a variable rotational speed.

SUMMARY OF THE INVENTION

It is an object of the invention to provide a storage medium that overcomes the above-noted deficiencies of the prior art.

To achieve this and other objects, the present invention is directed to a multilayer optical storage medium and to a method and apparatus for optically retrieving digital data stored as information pits in such a medium. The information is read without a need to spin the recorded medium, as it is necessary in the case of a known optical disc. The present invention offers advantages in terms of high information capacity, small size and relatively high axis speed.

The present invention is based on the reproduction of information in the form of an incoherent signal such as fluorescence, luminescence, or electroluminescence. Such an incoherent signal permits a higher spatial resolution in comparison to traditional coherent methods such as reflection, absorption and refraction (see in T. Wilson, C. Sheppard, "Theory and Practice of Scanning Optical Microscopy", Academic Press, London, 1984). The use of the incoherent signal leads to as much as an eightfold increase in spatial resolution in a 3D optical memory.

The present invention has particular utility to a read-only device. In that embodiment, the data are stored in a multilayer structure having many optically thin information layers separated by isolating layers. Data bits are stored in information layers as pits containing a fluorescent material. Each layer of data is organized into a plurality of regions, called pages.

Various devices are taught for reproducing the information from each page. The medium and a detector are moved relatively in X, Y, and Z directions to access a desired page. The medium can be moved, or the medium can be held stationary, and the detector can be moved. The selected page is illuminated by a light source, which can be one of an array of light-emitting diodes. The light may pass through pages other than the desired page. However, only the image of the desired page is focused on the detector, and the unfocused images of the other pages can be removed through spatial filtering. Alternatively, various waveguide illumination techniques can be used to illuminate only a specific page.

BRIEF DESCRIPTION OF THE DRAWINGS

Preferred embodiments of the present invention will be set forth in detail below with reference to the drawings, in which.

DETAILED DESCRIPTION OF THE PREFERRED EMBODIMENTS

Figure 1:
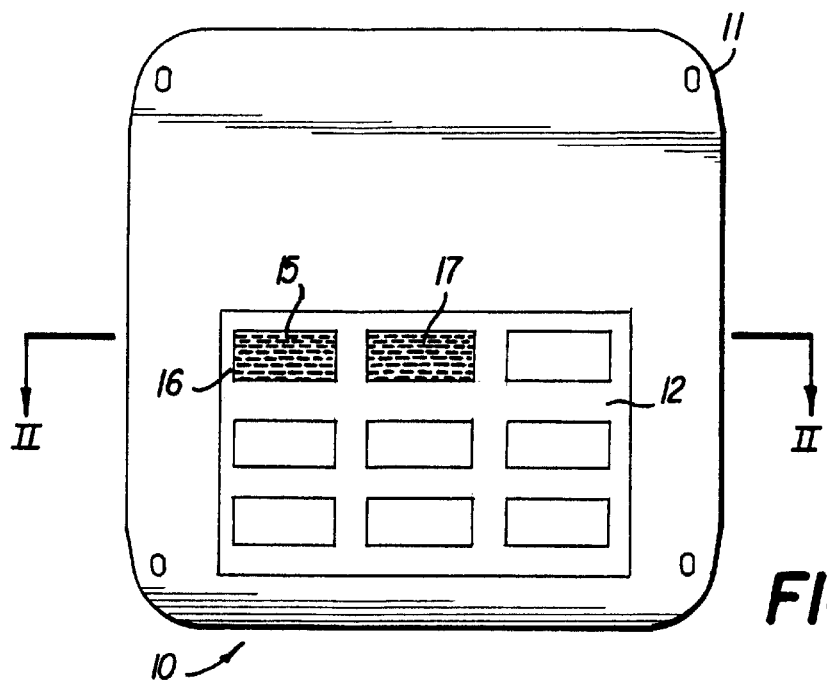
FIG. 1 shows a face-on view of an optical storage medium card according to a preferred embodiment.

Various preferred embodiments of the present invention will now be set forth in detail with reference to the drawings, in which like reference numerals refer to like components or steps throughout.

FIG. 1 shows an optical memory card 10, which comprises a substrate 11 formed of a thin plate in the shape of a rectangular parallelepiped, an optical storage medium 12, and a protective layer 25 (see FIG. 2) for protecting of the optical storage medium from the environment.

Substrate 11 is an opaque plastic plate for mechanical optical storage medium 12 and for fixing the card 10 in a card holder and retrieval device. In case an illuminating source and a registration device (e.g., a 2D image detector) are situated on the different sides of the card 10, there should be a transparent insertion in the substrate 11 where optical storage medium 12 is situated, unless the entire substrate 11 is transparent.

Information is stored in information pits 17 on straight-line tracks 16, organized in plurality of pages 15. Holes 14 serve for accurate fixing of the card 10 in a holder (not shown).

Figure 2:
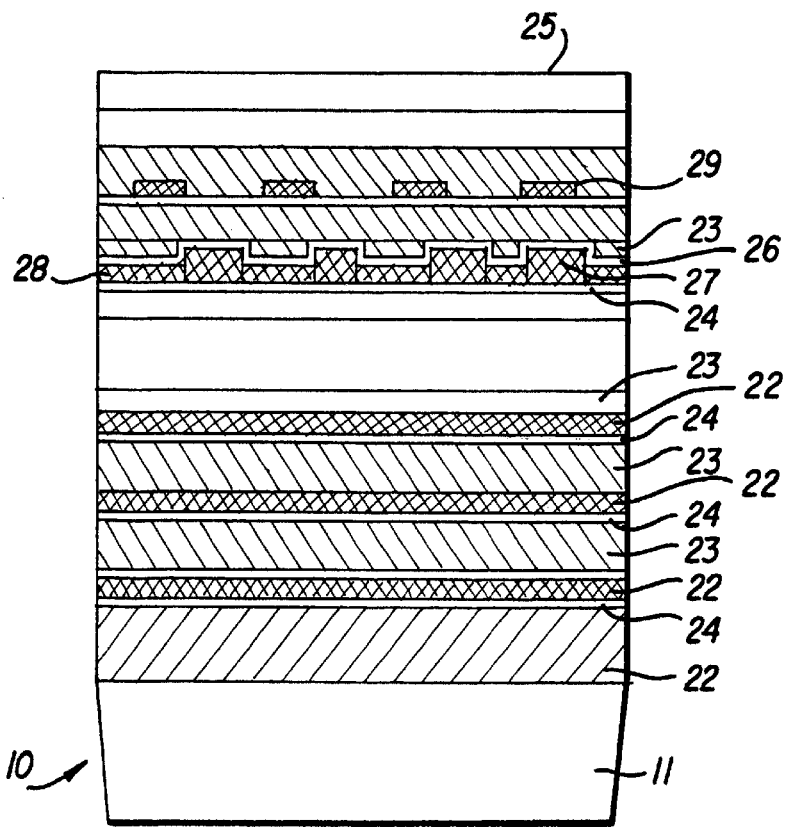
FIG. 2 shows a cross-sectional view of the same card.

The card 10 is preferably a many-layered structure with an alternation of photosensitive and separating layers, which are transparent at the wavelengths of the reading and fluorescing radiation. FIG. 2 shows a cross-sectional view of such a card 10 taken along the arrows II—II of FIG. 1. The card 10 includes the substrate 11 and, consistently located one above the other, information layers or data-carrying layers 22, divided by polymer layers 23 and assembled in a single block by gluing layers 24. Lacquer cover 25 protects the card 12 from damage. Substrate 11 is formed as a flat plane made of glass, polycarbonate, polymethylmetacrylate or other polymer material.

Pages located in different information layers one under another form a "page-stack" or information frame. Information from such a frame can be read without mechanical moving of reading head in the plane of the card by focusing of the objective from one page to another. This matter will be explained in fuller detail below.

Additional structures can be provided for addressing, to ensure that the correct page is being read. Addressing layers can be provided as the first or last layers of the medium 10. For example, a layer can include raised areas 27 and depressed areas 28 separated by an adhesive layer 26 from the adjacent intermediate layer 23. An additional addressing layer can include regularly spaced portions 29 embedded in an intermediate layer.

Protective 25, intermediate 23, adhesive 24 and information 22 layers have reflection ratios at the reading and fluorescence wavelengths close to that of substrate 11. It is preferable to remove light reflection on the inter-layer boundaries.

There are several ways to obtain the intermediate layers 23. Two such ways whose use is contemplated in the present invention are polymer solution pouring on the optical card with following solvent evaporation and lamination of an isotropic polymer film with an adhesive on the optical card. The use of UV-cured liquid or "dry film" photo-polymerized compositions is the most interesting method for obtaining intermediate layers.

The reading is performed by illumination of one or several pages and imaging by an optical system of a selected page onto a matrix of light sensors (CCD or photodiode array). A laser, LED or matrix of LED's (lasers) can be used for excitation of pit fluorescence. For reading information from a chosen page (pages), a light beam illuminates this page (pages), exciting fluorescence.

Figure 3:
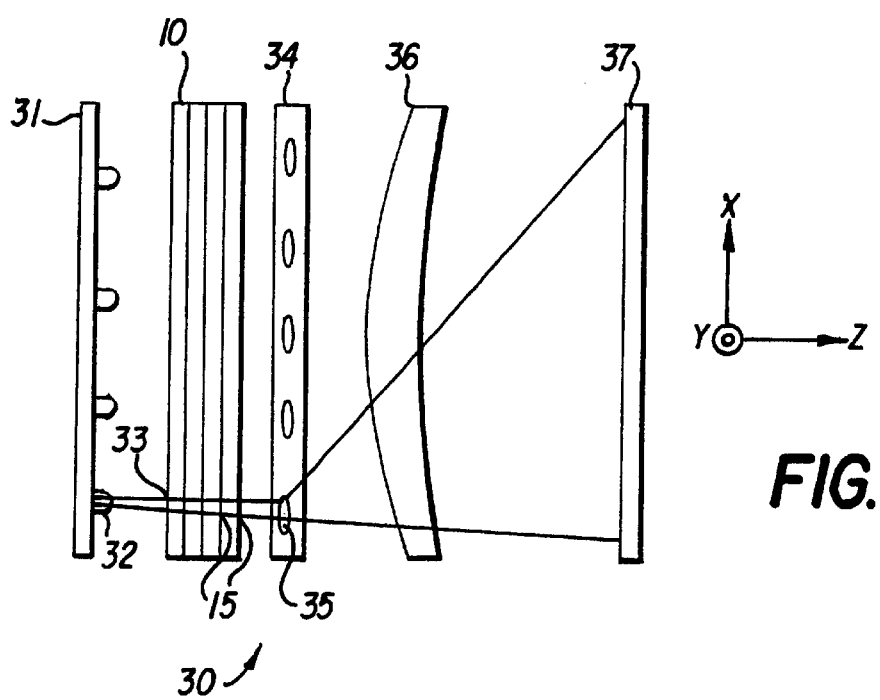
FIG. 3 shows a schematic diagram of an arrangement for reproducing information from the card of FIGS. 1 and 2.

Such an arrangement is shown in FIG. 3. In the arrangement 30, a matrix of photodiodes 31 includes multiple, individually addressable photodiodes 32 arranged in the same arrangement as the pages on the card 10. A single photodiode 32 is actuated to illuminate a frame 33 of pages 15 on the card 10 with fluorescence-exciting light. A lenslet card 34 having multiple lenslets 35 is disposed to intercept the light emitted by fluorescence from the frame 33 in the card 10. A single lenslet 35 in the lenslet card 34 intercepts the light from the frame 33 corresponding thereto. The lenslet 35 and a field lens 36 focus an image of the desired page 15 in the frame 33 onto a photosensor matrix 37.

Figure 4:
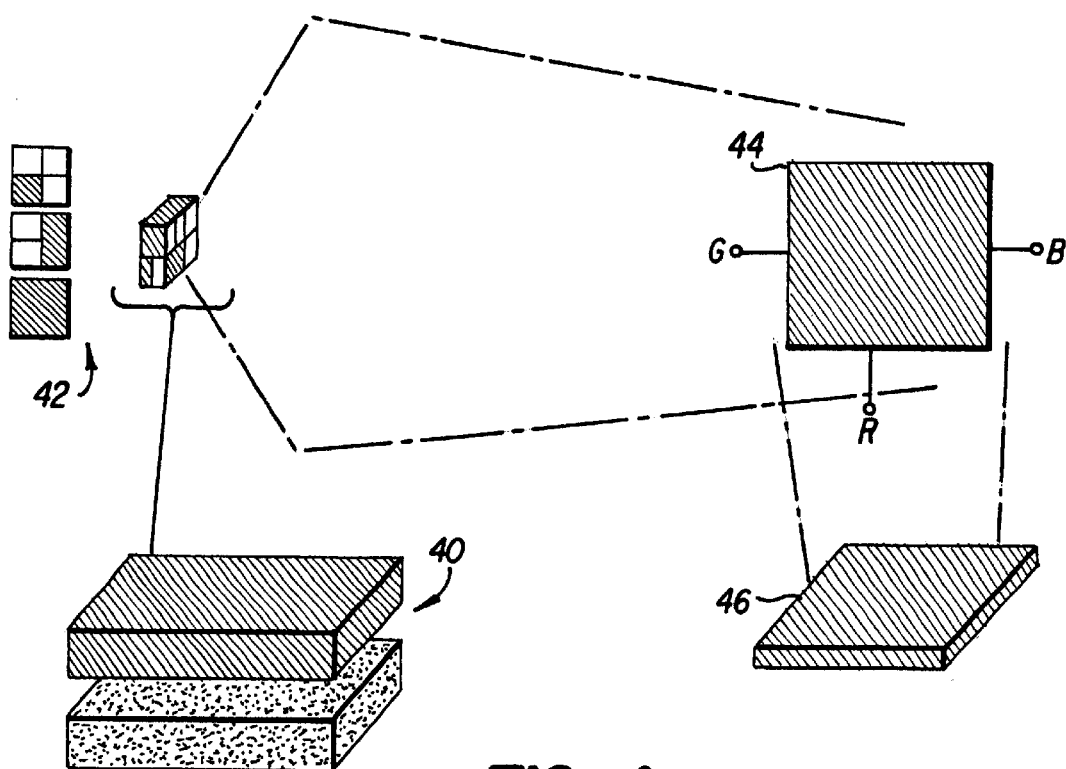
FIG. 4 shows a technique for increasing information density through the use of colors.

The information density is defined by the size of the pits in each page 15, which is limited by optical resolution. On the other hand, because of the use of incoherent light, the information density is not limited by the diffraction limit. It is possible to use different dyes with different colors or different frequencies of exciting light for increasing data density. As shown in FIG. 4, a data information array 40 includes data pits 42. The image of each data pit 42 is focused onto a corresponding CCD pixel 44 in a CCD patch 46. The CCD pixel 44 outputs three signals, R, G and B, corresponding to the three color components of the light emitted by fluorescence from the data pit 42.

Figure 5:
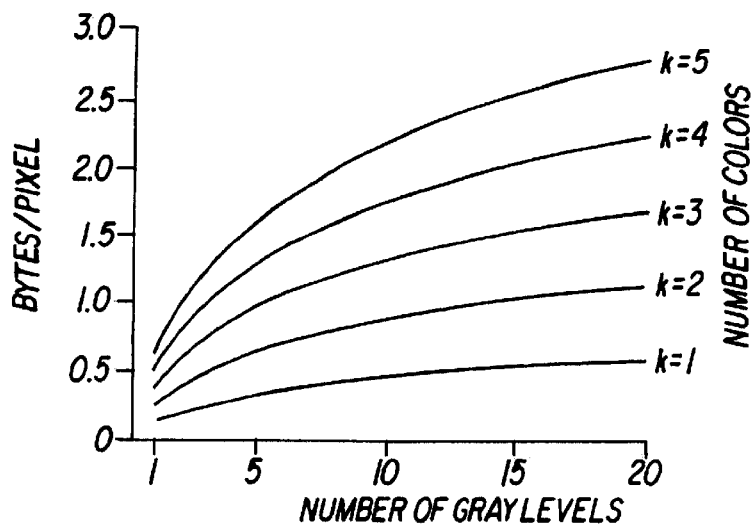
FIG. 5 shows a graph of information density per pit as a function of the number of gray levels and the number of colors.

Another possibility for increasing of information capacity is to use gray levels. These gray levels can be realized by variation of the concentration of dye in the pit or by variation of its geometry. The dependence of pit storage capacity on the number of gray levels and the number of colors is depicted on FIG. 5. For 20 gray levels and five colors, close to three bytes can be stored per pit.

Figure 6:
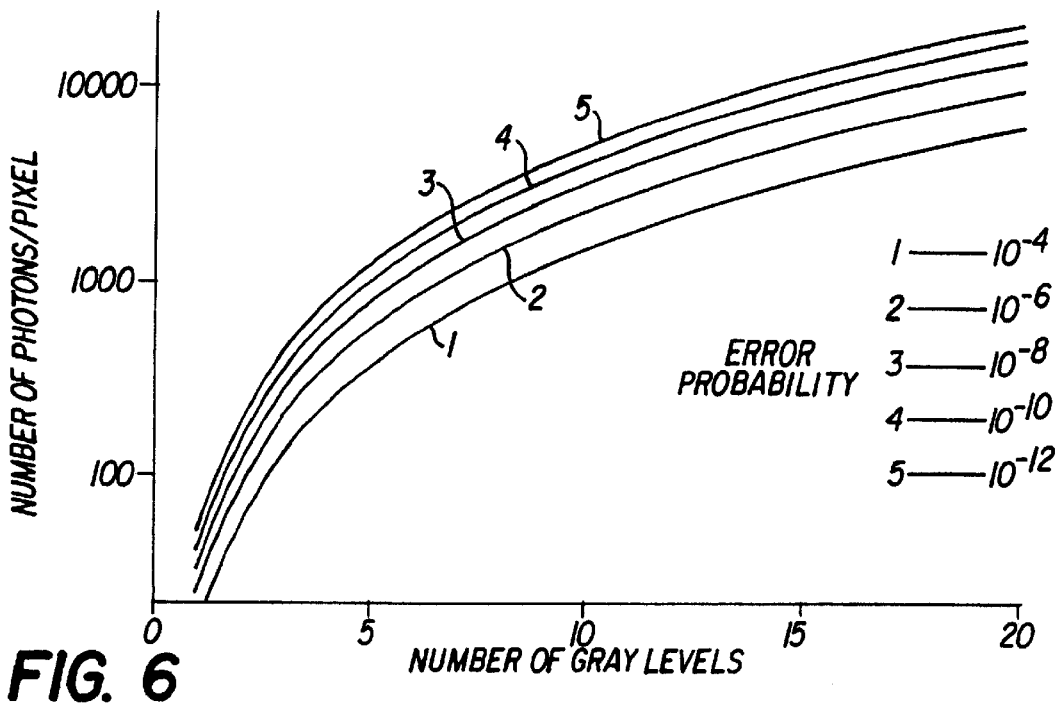
FIG. 6 shows the relation among the number of gray levels, the number of photons per pixel, and the error probability.

Fundamentally, the number of gray levels is limited by shot noise. Shot noise error probability is depicted in FIG. 6, which shows that gray levels can be easily used in a fluorescent multilayer card. For example, only 1000 photons are needed to realize 5 gray levels with $10^{-12}$ error probability.

For separation of pages 15 from the different layers in a frame 33, the image of the desired page is imaged on the plane of the photosensor matrix. This is obtained by moving of the optical card or photosensor matrix or an intermediate mirror. The photosensor has size of about 1 cm and 1000*1000 elements (pixels).

The optimal method of reading is to image one pit onto several pixels. Thus, the page has the size of several hundreds of microns. The typical magnification of optical system is about 20. The size of the page image on the CCD camera is about 1 cm for spatial resolution of this size one uses a lens with large numerical aperture, NA=0.3–0.8. The focal distance and diameter of such a lens are a few mm. The parasitic signal from non-read layers is suppressed by spatial filtering during the imaging. Additional spatial resolution is provided by an opaque mask with plurality of pinholes. The image is obtained by scanning of the mask in both lateral XY directions. The readout drive has a system for precise positioning of the optical card. The typical size of an optical card is 8.5*5.5*0.1 cm, and the typical size of the information region is 6.5*3.5*0.1 cm. The thickness of the readout drive is about 1.2 cm.

There are possible several proper embodiments.

1. Step-like moving of the optical card. With the coordinate axes shown in FIG. 3, it will be seen that selecting the proper page for reproduction involves XY moving for transition from page to page and moving along the Z coordinate for reading from a desired one of several layers. The photosensor matrix and objective lenselets are fixed. After every movement the optical card becomes fixed too. The appropriate lenslet images the desired page onto the photosensor matrix. The information optical card moves along Z coordinate.

2. The fixed optical card. A reading head including a photosensor matrix and objective lenslets moves step-like in the XYZ directions. Two read heads can be provided for faster access. At the moment of reading by the first head, the second head is positioned.

The card can be produced with the lenslets bonded thereto. The size and center of each lenslet coincide with the size and center of the each page. This design was described by J. T. Russell in his patent (U.S. Pat. No. 5,696,714, 1997). This lenslets card was used in the non-movable design. The common field lens imaged every page to the photosensor matrix.

Figure 7:
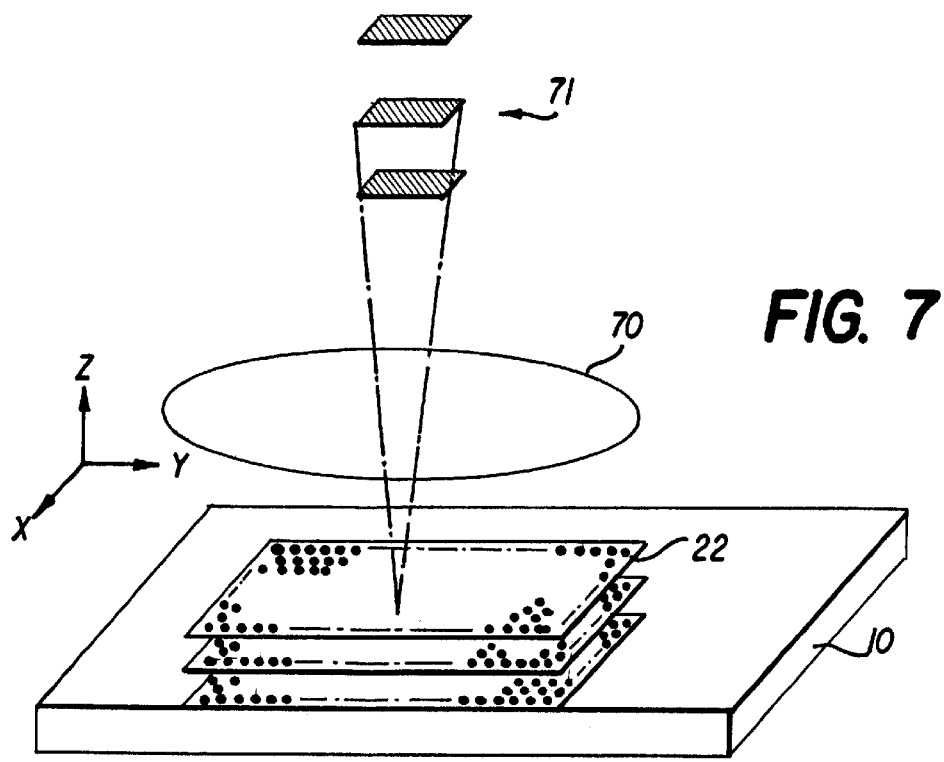
FIG. 7 shows the formation of page images from different layers of the card in different parallel planes.

For the reading of a multilayer fluorescent card, the Russell design must be modified. As explained above, the card 10 has multiple layers 22 with pits formed therein. As a consequence, as shown in FIG. 7, an optical system 70 forms images 71 of pages from the different layers 22 in different parallel planes. For the reading of a desired page, the photosensor matrix or the intermediate mirror must be moved along the Z axis so that the correct image 71 falls on the photosensor matrix.

The images of the different layers have different sizes. The distance between the image and the focal plane is given by follow expression $b_n=F(1+K_n)$, where $K_n=F/(a*n)$, a is the distance between adjacent layers.

Figure 8:
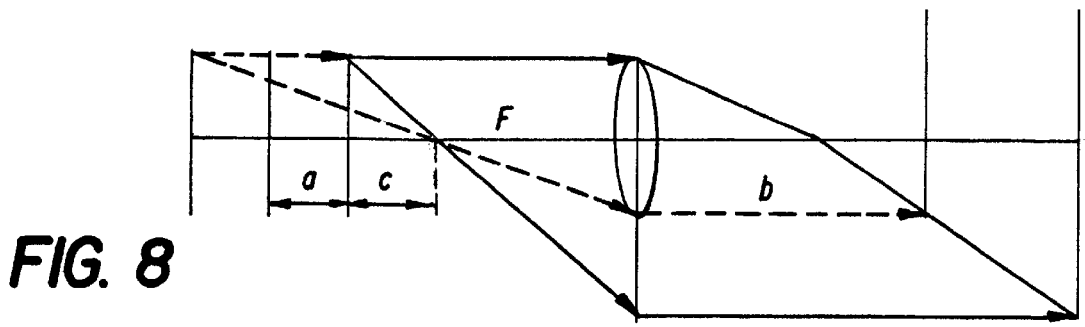
FIG. 8 is an optical diagram showing the computation of the distance between the images of two layers.

For example, for ten layers, and for F=1 mm, $K_l$=10, a=100$\mu$ the distance between the first and tenth layers is 0.1 mm, and distance between their images is 6 mm, as shown in the optical diagram of FIG. 8.

For optimal imaging, the density of recorded information may be different from layer to layer. An additional lenslet card can be provided near the photosensor matrix, which is moved together with an intermediate mirror. In that case, the lenslet card is fixed inside the read drive, and the information card 10 is moved along the Z axis in order to be positioned at the object plane. It is possible to use an ordinary lens like those used in CD or DVD drives for reading the fluorescent signal. The optical aberrations may be corrected by diffractive correctors. In all cases, after movement of the optical elements, they are positioned by tuning with high accuracy.

The estimation of the fluorescence intensity. Let P be the intensity of the exciting light, S the area of the page, s the area of the pit, $\alpha$ the absorption coefficient in the one layer, $\phi$ the quantum efficiency, and $\xi$ the spherical angle. The intensity of fluorescence from 1 pit is $W=P*s*\phi*\xi/S$. For P=1 mW, $s=1\mu^2$, S=1 $mm^2$, $\alpha$=0.1, $\phi$=0.9, $\xi$=0.03 we get $W=10^7$ photons/sec. If the response time of the photosensors is 1 msec the total number of photons on the pit image on the CCD matrix is $N=10^4$ photons. This corresponds to a data rate of 250 MB/s.

The estimation of the number of readings. Let the density of the molecules be $10^{19}$ $cm^{-3}$; then in the one pit are $5*10^6$ molecules. Each molecule emits $10^7$ times. The whole number of the photons is $5*10^{13}$. For the effective spherical angle $\xi$=0.05 one pixel gets $2.5*10^{12}$ photons. Since for one read it is necessary $3*10^4$ photons, for the read number we get $10^8$.

Figure 9:
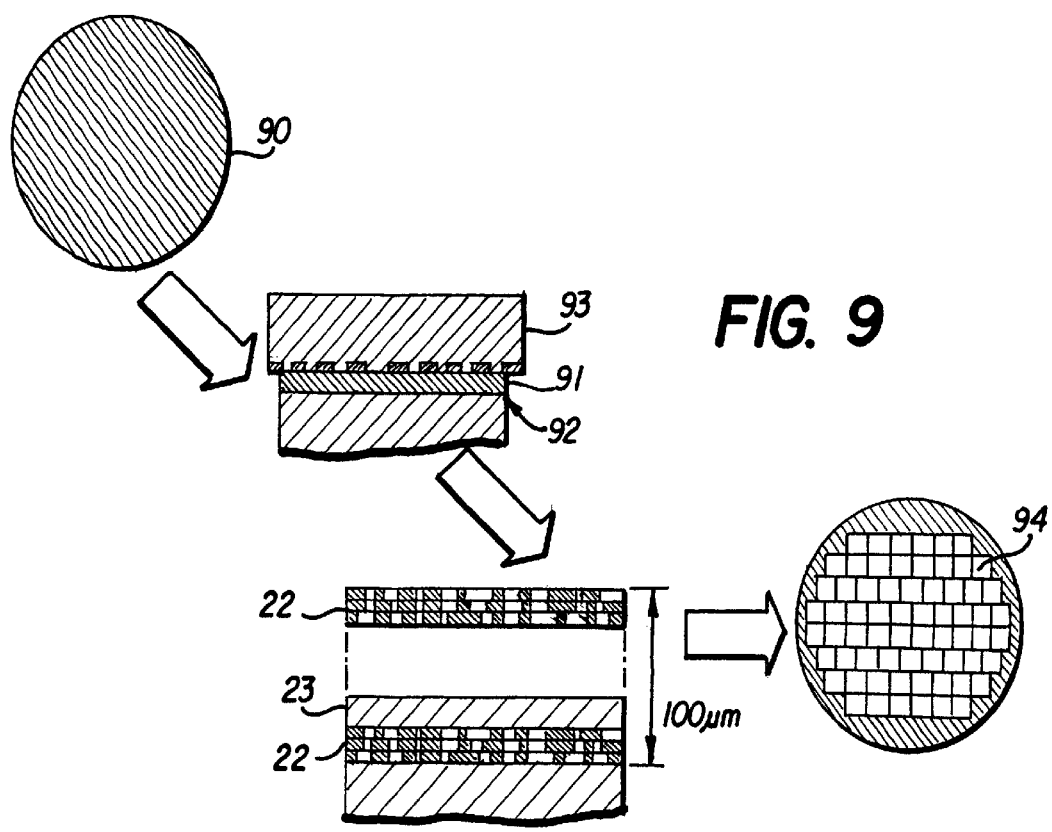
FIG. 9 shows steps in the production of the card of FIGS. 1 and 2.

Contact photolithography technology is used for fluorescent multilayer card production, as shown in FIG. 9. First, a glass or polymeric substrate 90 is provided. A photosensitive composition (photoresist 91 with dye 92, dye 92 in polymer and so on) is deposited on photomask 93, exposed and then superimposed to the glass or polymeric substrate 90. Then the operations are repeated with a new photomask. In the bottom the production of the 30th layer is shown. The result is a substrate with information "chips" 94.

Figure 10:
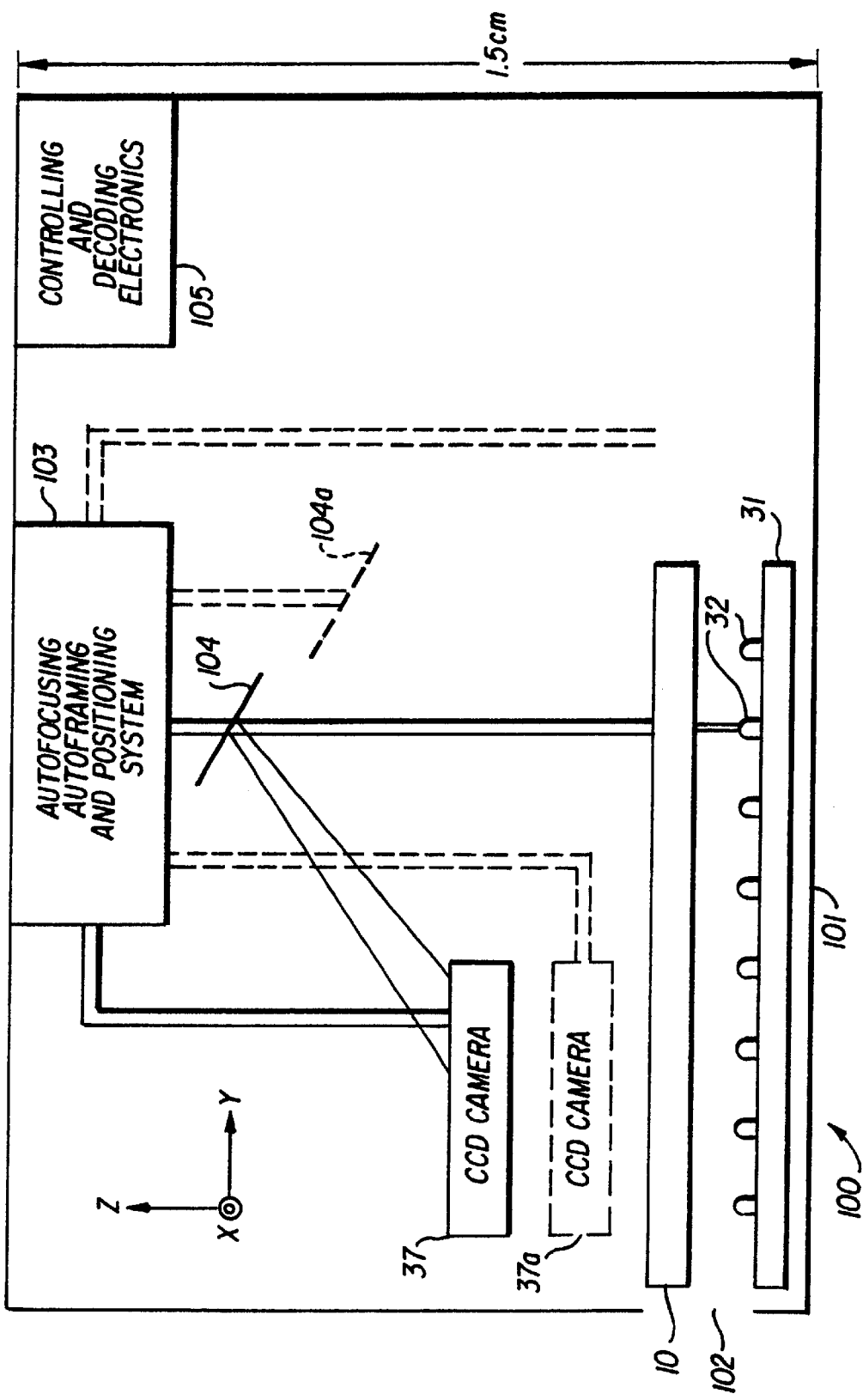
FIG. 10 shows a readout drive for the card of FIGS. 1 and 2.

Readout drive A readout drive is shown in FIG. 10. The basic principles of operation have been explained above with reference to FIG. 3. Any feature or operation present in the device of FIG. 3 can be included in the device of FIG. 10.

The readout drive 100 of FIG. 1 includes a case 101 having a slot 102 to receive a card 10. On a lenslet card 31, a lenslet 32 is illuminated to excite the fluorescence in a desired frame of the card 10. An autofocusing, autoframing and positioning system 103 moves a mirror 104 and a CCD camera 37 (or, in the alternative, the card 10) to form an image onto the CCD camera 37. As explained above with reference to FIG. 7, movement of the mirror 104 and the CCD camera 37 (or of the card 10) to effect focusing in the Z direction allows a desired page within a frame to be imaged.

In embodiments in which the mirror 104 and the CCD camera 37 are moved, an additional mirror 104a and an additional CCD camera 37a can be provided to form a second read head. When one mirror and CCD camera are imaging a page, the other mirror and CCD camera can be moved.

It is anticipated that the read device 100 can be made to fit within a 1.5 cm form factor.

Waveguide illumination

As an alternative technique for addressing a specific page in a frame, waveguide illumination techniques can be used.

Figure 11:
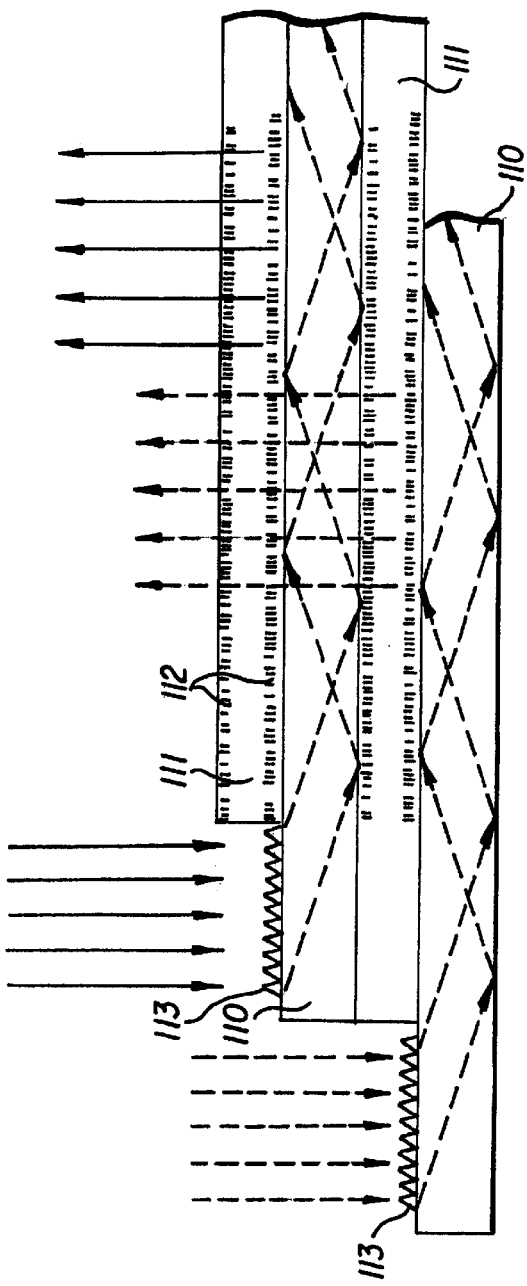
FIGS. 11 and 12 show a waveguide illumination technique.

FIG. 11 shows two planar waveguides 110 sandwiched with two information layers 111 distinguished by blue pits 112. The pits 112 are placed at both sides of each information layer 111, so that altogether there are four planes of information pits 112. In fact there may be many more information layers, and accordingly twice as many planes of information pits, served by each waveguide 110. Light for exciting the fluorescence of the pits 112 is introduced into the waveguides 110 through blazed gratings 113 or other appropriate optical elements.

The number of information layers per waveguide will be limited by the ability of optical system to distinguish between the layers of fluorescent pits in the readout process, i.e., eventually by the ratio of signal to noise. A remarkable advantage of fluorescence, as incoherent emission, is in that the layers of fluorescent pits separated at a distance of at least one order of magnitude bigger than the distance between the pits, the pits can be distinguished by an appropriate microoptical system. Experiments have shown that the cross-talk from different layers can be decisively eliminated in such a microoptical system. That is to say, that if a typical distance between the pits is 2 micrometers then the information layers separated at a distance of 10 micrometers will be well distinguished by the microoptical system. Even less is sufficient for adequate distinction. The number of waveguides relative to the number of information layers may vary dependent on two parameters: the windows area versus the information area and the number of windows per waveguide (it can be more than one and the intensity of irradiation from each of them can be controlled).

It should be noted that the above parameter values are in good correspondence with the presently existing technological capabilities for manufacturing of inexpensive multilayer memory matrices. At the same time these are the parameter values that should be achieved to provide for the growth of memory capacity in the future.

Figure 12:
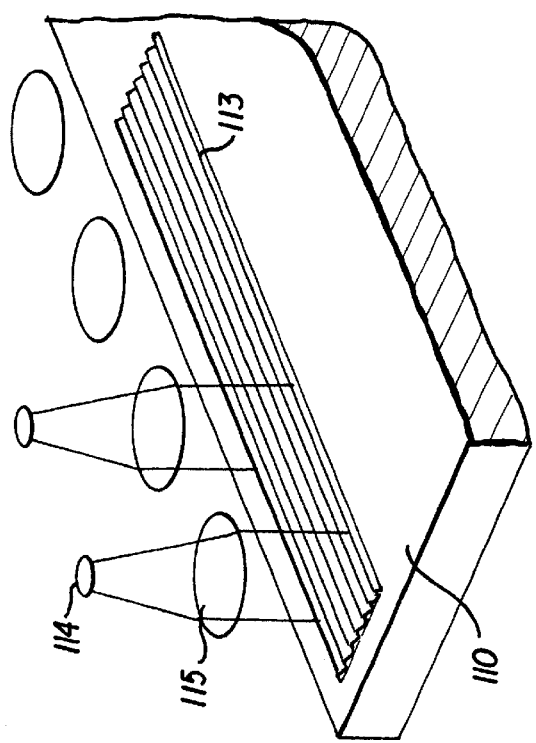

Light injection into the waveguide 110 is shown in FIG. 12. As a preferred prime source of light, a linear geometry of LED's 114 and lenslets 115 is contemplated.

While preferred embodiments of the present invention have been set forth above in detail, those skilled in the art who have reviewed the present disclosure will readily appreciate that other embodiments can be realized within the scope of the present invention. For example, while an array of lenslets has been taught for illumination, a single light source and a scanning optical system can be used instead. Also, any system of optics and positioning that effects the relative movement between the card and the photodetector array in the X, Y and Z directions can be used. Therefore, the present invention should be construed as limited only by the appended claims.

We claim:

1. A device for reproducing information from an information storage medium having a plurality of information layers each having a plurality of pages of information, the device comprising:

a light source for emitting light for illuminating a selected page to form an image of the selected page;

an image detector for receiving the image and for outputting image signals representing the image;

a processor for processing the image signals to reproduce the information;

positioning means for positioning the information storage medium relative to the image detector for selecting the selected page;

wherein the positioning means comprises means for positioning the information storage medium relative to the image detector in (i) a Z direction to select an information layer from among the plurality of information layers and (ii) X and Y directions to select the page from among the pages on the selected information layer; and wherein the positioning means comprises means for moving the image detector in at least the Z direction while holding the information storage medium stationary.

2. The device of claim 1, further comprising a separating layer between each adjacent two of the information layers.

3. The device of claim 1, wherein each of the plurality of pages contains the information as pits filled with a dye for emitting the incoherent radiation.

4. The device of claim 3, wherein the dye is a fluorescent dye.

5. The device of claim 3, wherein the dye is a luminescent dye.

6. The device of claim 3, wherein the dye is an electroluminescent dye.

7. The device of claim 1, further comprising at least one waveguide for introduction of exciting radiation to the plurality of information layers.

8. The device of claim 7, wherein the at least one waveguide comprises a blazed grating for the introduction of the exciting radiation.

9. The device of claim 1, wherein the processor performs spatial filtering to remove effects from pages other than the selected page that fall in a path of the light from the light source.

10. The device of claim 1, wherein the positioning means comprises means for moving the information storage medium in at least the Z direction while holding the image detector stationary.

11. The device of claim 1, wherein:
the image detector comprises two independently functioning read heads; and
the positioning means comprises means for moving one of the read heads while the other read head is held stationary for receiving the image and outputting the image signals.

12. The device of claim 1, wherein each of the pages reproducing the information contained therein as incoherent radiation when excited.

13. The device of claim 1, wherein the pages on each of the information layers are arranged in a rectilinear arrangement.

* * * * *